(12) United States Patent
Kinsman

(10) Patent No.: US 6,979,902 B2
(45) Date of Patent: Dec. 27, 2005

(54) CHIP SIZE IMAGE SENSOR CAMERA MODULE

(75) Inventor: Larry D. Kinsman, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/796,110

(22) Filed: Mar. 10, 2004

(65) Prior Publication Data

US 2005/0200012 A1    Sep. 15, 2005

(51) Int. Cl.⁷ ............................................. H01L 23/48
(52) U.S. Cl. ...................... 257/737; 257/432; 257/433
(58) Field of Search .............................. 257/737, 432, 257/433

(56) References Cited

U.S. PATENT DOCUMENTS

| | | | |
|---|---|---|---|
| 6,384,397 B1 * | 5/2002 | Takiar et al. | 250/208.1 |
| 6,528,778 B1 * | 3/2003 | Kimba et al. | 250/214.1 |
| 6,768,516 B2 * | 7/2004 | Yamada et al. | 348/340 |
| 2003/0201447 A1 * | 10/2003 | Yamazaki et al. | 257/79 |
| 2003/0223008 A1 * | 12/2003 | Kim et al. | 348/340 |
| 2004/0027477 A1 * | 2/2004 | Tamura et al. | 348/340 |
| 2004/0188838 A1 * | 9/2004 | Okada et al. | 257/738 |

* cited by examiner

*Primary Examiner*—David Nelms
*Assistant Examiner*—Tu-Tu Ho
(74) *Attorney, Agent, or Firm*—Dickstein Shapiro Morin & Oshinsky LLP

(57) ABSTRACT

An image sensor camera module includes a dielectric flex tape and a semiconductor die including an imager array. Die attach pads are formed along one edge of the die. The dielectric flex tape overlaps either the top or the bottom of the die, and connections between the die and the tape are made using solder bumps or wire bonds, for example. No supporting substrate other than the tape is required. A lensing structure can be attached directly to the die.

46 Claims, 4 Drawing Sheets

CHIP SIZE IMAGE SENSOR CAMERA MODULE

FIELD OF THE INVENTION

The present invention relates generally to a compact semiconductor module, and, more specifically, to a chip size image sensor camera module.

BACKGROUND OF THE INVENTION

Integrated circuits, including a semiconductor die such as charge-coupled-devices (CCD) and complementary metal oxide semiconductor (CMOS) sensors have commonly been used in photo-imaging applications. Such sensors typically contain thousands of pixel cells in a pixel array on a single chip. Pixel cells convert light into an electrical signal that can then be stored and recalled by an electrical device such as, for example, a processor.

Semiconductor dies typically are packaged and inserted into imaging devices such as, for example, digital cameras. FIG. 1 illustrates a conventional image sensor module 2, shown in an exploded perspective view. Module 2 includes a semiconductor die 4 disposed on a cushion 6 and having series of bump pad connectors 8 located adjacent the four edges of the top surface of the semiconductor die 4. Semiconductor die 4 includes a pixel array (not shown). Anisotropic conductive film (ACF) 10 connects flex tape 12 to die 4 and connectors 8. Flex tape 12 contains electrical traces that link to a connector 14, and has an opening 16 through which light travels to the pixel array. A stiffener 18 provides additional support to the module 2. An infrared (IR) filter 20, aligned in the optical path between the pixel array and a lens assembly 22, is adhered onto the flex tape 12. The lens assembly 22 includes a housing 24 supporting a lens barrel 26 containing a lens system for focusing light onto the pixel array.

In operation, light radiation enters the lens barrel 26 of the module 2. Harmful IR radiation is filtered out by the IR filter 20. Light radiation incident on the pixel array of semiconductor die 4 is converted to electrical output signals by the circuitry on semiconductor die 4. The electrical traces in flex tape 12 conduct the electrical output signals from the semiconductor die 4 to external circuitry (not shown) connected to connector 14. The external circuitry may include processing circuits for storing, compressing, manipulating, or displaying an acquired image.

While the package illustrated in FIG. 1 works well, the assembly process includes several steps, and requires forming flex tape 12 with opening 16. Also, the form factor of module 2 is increased in width and length by the placement of bond pads 8. Thus, a semiconductor die package that has a smaller form factor, and which requires fewer assembly steps, is desired.

BRIEF SUMMARY OF THE INVENTION

The present invention, in its various exemplary embodiments, provides a chip size image sensor camera module in which a flex tape substrate having tape terminal pads on one end is connected to die attach pads located on one edge of an image sensor die. An IR filter can be adhered directly to the die. A camera lens structure completes the module.

BRIEF DESCRIPTION OF THE DRAWINGS

The above-described features of the invention will be more clearly understood from the following detailed description, which is provided with reference to the accompanying drawings in which.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

As used herein, the term "flexible substrate" is to be understood to include any material, including, but not limited to, epoxy, polyimide, polyester, or any other material capable of withstanding a 180° angle bend at a radius of at least ⅛" or less. Similarly, a "flexible substrate" may be any material having substantially the same or equivalent properties as DuPont Kapton® or Oasis®. Specifically, the material may have a tensile strength of about 10 kpsi or greater, a tensile modulus of about 200 kpsi or greater, and/or an elongation property of about 25% or more (values based on ASTM D-882-83 Method A).

Figure 2:
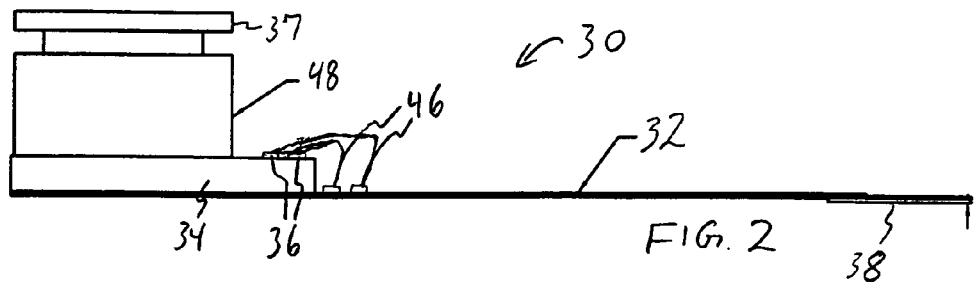
FIG. 2 illustrates a semiconductor die module, shown in side elevation, constructed in accordance with a first exemplary embodiment of the invention.
Figure 3:
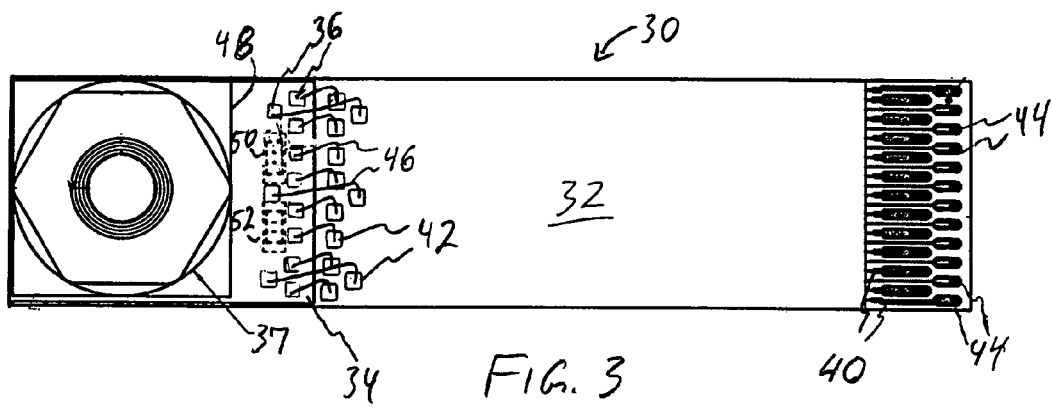
FIG. 3 illustrates the semiconductor die module of FIG. 2, shown in top plan view.

Referring now to the drawings, where like reference numbers designate like elements, FIGS. 2 and 3 illustrate an exemplary semiconductor die module 30 constructed in accordance with a first embodiment of the invention. Specifically, FIG. 2 illustrates a side elevation view of the semiconductor die module 30. FIG. 3 illustrates a plan view of the semiconductor die module 30. The semiconductor die module 30 has a flex tape substrate 32 supporting a semiconductor die 34. Semiconductor die 34 contains a pixel array 35 (FIGS. 6 and 7) made up of CMOS pixels, for example. Die attach pads 36 are formed on an upper surface along one edge of the semiconductor die 34. The semiconductor die module 30 includes a lens barrel 37 containing a lens system for focusing light onto the pixel array 35. Lens barrel 37 can be held in place by a lens holder 71 (FIG. 8) attached directly to semiconductor die 34, or to an infrared filter, as described further below. A polyimide stiffener 38 is provided at an end of the tape substrate 32 opposite to the end on which the semiconductor die 34 is attached. Traces 40 formed in or on the tape substrate 32 connect tape terminal pads 42 to connector pads 44. Wire bonds 46 are attached between die attach pads 36 and tape terminal pads 42. Module 30 can include a lead shield 48 surrounding lens barrel 37. Storage capacitors 50 and 52 can be included in semiconductor die 34 on one side of the die under the area occupied by the die attach pads 36. The benefits of module 30 are discussed below with respect to FIGS. 6–9.

Figure 4:
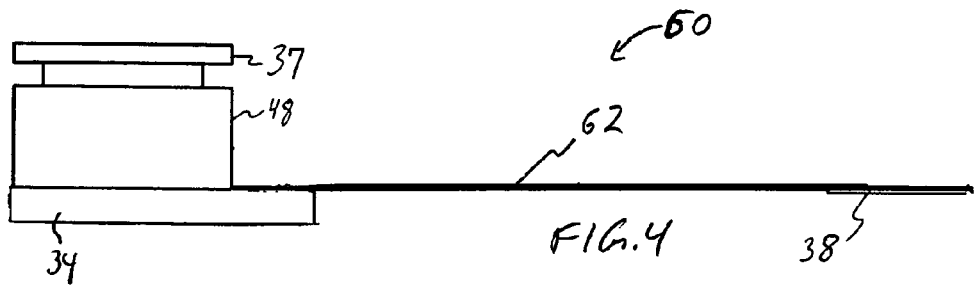
FIG. 4 illustrates a semiconductor die module, shown in side elevation, constructed in accordance with a second exemplary embodiment of the invention.
Figure 5:
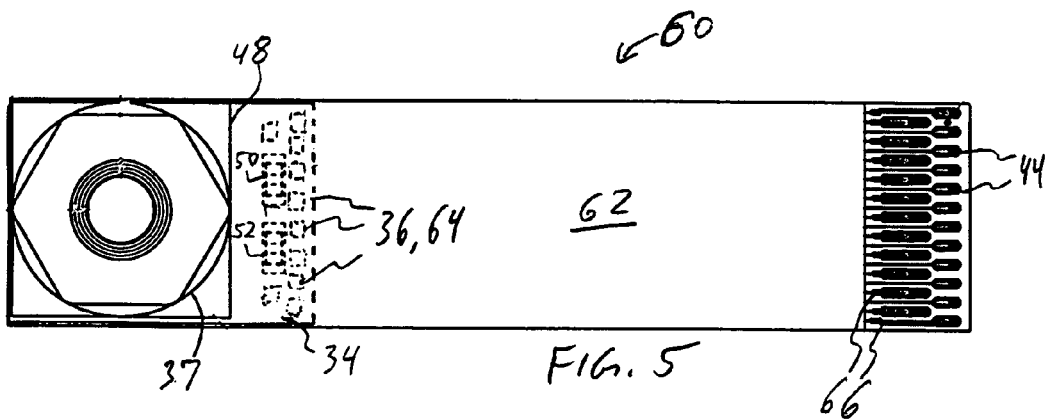
FIG. 5 illustrates the semiconductor die module of FIG. 4, shown in top plan view.
Figure 6:
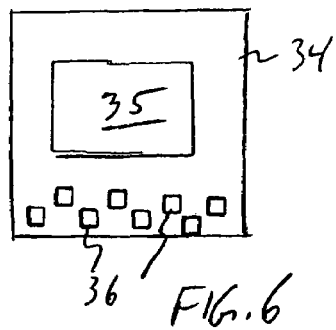
FIG. 6 illustrates a step of providing a semiconductor die for assembling an imaging device according to an exemplary embodiment of the present invention.
Figure 7:
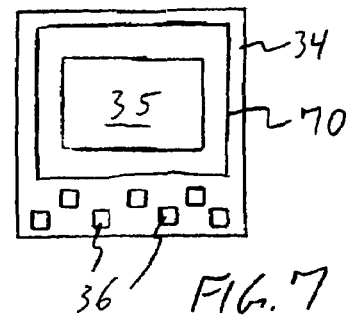
FIG. 7 illustrates installing an infrared filter in a further step of assembling an imaging device according to an exemplary embodiment of the present invention.

Referring next to FIGS. 4 and 5, an exemplary semiconductor die module 60 constructed in accordance with a second embodiment of the invention is shown. Specifically, FIG. 4 illustrates a side elevation view of the semiconductor die module 60. FIG. 5 illustrates a plan view of the semiconductor die module 60. The semiconductor die module 60 has a flex tape substrate 62 attached to semiconductor die 34. Semiconductor die 34 contains a pixel array 35 (FIGS. 6 and 7). Die attach pads 36, formed on the upper surface along one edge of the semiconductor die 34, preferably are bumped for connection to the tape substrate 62, as described further below. The semiconductor die module 60 includes a lens barrel 37 containing a lens system for focusing light onto the pixel array 35. Lens barrel 37 can be held in place by a lens holder (not shown) attached directly to semiconductor die 34 or to an infrared filter, as described further below. A polyimide stiffener 38 is provided at an end of the tape substrate 62 opposite to the end on which the semiconductor die 34 is attached. Traces 66 formed in the tape substrate 62 connect tape terminal pads 64 to connector pads 44. Die attach pads 36 are connected directly, by reflow, tape automated bonding (TAB), or anisotropic conductive film (ACF), for example, to tape terminal pads 64. Module 60 can include a lead shield 48 surrounding lens barrel 37. Storage capacitors 50 and 52 can be included in semiconductor die 34 on one side of the die under the area occupied by the die attach pads 36. The benefits of module 60 are discussed below with respect to FIGS. 6–9.

Figure 9:
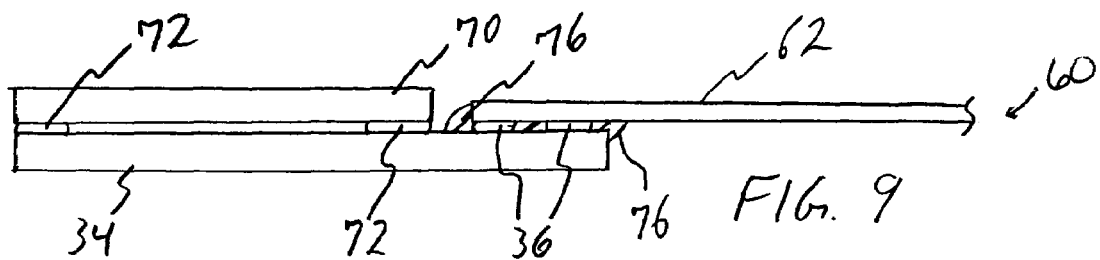
FIG. 9 illustrates attaching a flex tape substrate to a top surface of the semiconductor die in an alternative step of assembling an imaging device according to an exemplary embodiment of the present invention.
Figure 8:
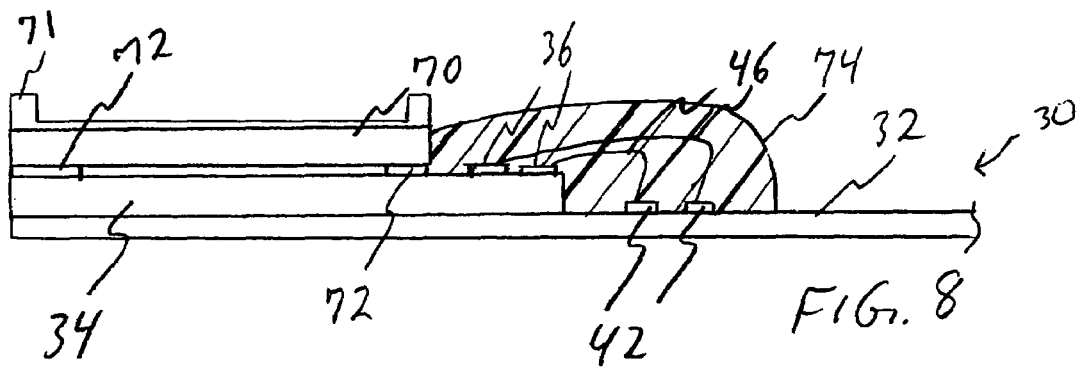
FIG. 8 illustrates attaching a flex tape substrate to a bottom surface of the semiconductor die in an alternative step of assembling an imaging device according to an exemplary embodiment of the present invention.

Referring to FIGS. 6–9, a process of forming modules 30 and 60 begins by providing the semiconductor die 34, illustrated in FIG. 6. FIGS. 6 and 7 depict steps common to forming modules 30 and 60, while FIG. 8 shows additional assembly steps for module 30, and FIG. 9 shows additional assembly steps for module 60. Semiconductor die 34 includes a pixel array 35 and die attach pads 36. Referring to FIG. 7, an infrared (IR) filter in the form of IR cover glass 70 optionally is adhered directly to semiconductor die 34 over pixel array 35, preferably using an epoxy adhesive 72 applied to adhere around the perimeter of the cover glass 70, as shown in FIGS. 8 and 9. As noted, the steps described in connection with FIGS. 6 and 7 are common to the assembly of both exemplary modules 30 and 60. As a further option, a lens holder 71, shown in FIG. 8, can be applied directly to the cover glass 70. Alternatively, the cover glass 70 need not be installed, and the lens holder can be applied directly to semiconductor die 34.

Referring to FIG. 8, additional steps proceeding from those shown in FIGS. 6 and 7 are shown for forming the module 30 according to an exemplary embodiment of the present invention. Module 30 is discussed above in connection with FIGS. 2 and 3. FIG. 8 shows module 30 in a detailed side elevation view after flex tape substrate 32 is attached to semiconductor die 34, and wire bonds 46 are installed to connect die attach pads 36 to tape terminal pads 42. An encapsulant 74 can be applied, by a transfer mold process, for example, to further protect the module and lock the flex tape substrate 32 onto the semiconductor die 34. Although flex tape substrate 32 is illustrated as completely overlapping the bottom surface of semiconductor die 34, partial overlap of substrate 32 and die 34 also is contemplated by the present invention.

Referring to FIG. 9, additional steps proceeding from those related to FIGS. 6 and 7 are shown for forming the module 60 according to an exemplary embodiment of the present invention. Module 60 is discussed above in connection with FIGS. 4 and 5. FIG. 9 shows module 60 in a detailed side elevation view after flex tape substrate 32 is attached to the top surface of semiconductor die 34, and bump pads 36 are connected directly to tape terminal pads 42. An underfill encapsulant 76 can be applied, by a transfer mold process, for example, to further protect the module 60 and lock the flex tape substrate 62 onto the semiconductor die 34.

The flex tape substrates 32 and 62 provide greater resistance to breakage during processing, while preserving the overall rigidity necessary for the placement of the semiconductor die 34. While any flexible tape substrate 32, 62 can be used, exemplary preferred materials for the flex tape substrate 32, 62 include epoxy, polyimide, polyester, any other material capable of withstanding a 180° angle bend, preferably at a radius of at least ⅛" or less, or any material having substantially the same or equivalent properties as DuPont Kapton® or Oasis®, for example, having a tensile strength of about 10 kpsi or greater, a tensile modulus of about 200 kpsi or greater, and/or an elongation property of about 25% or more (values based on ASTM D-882-83 Method A). Additionally, the flex tape substrate 32, 62 allows for a more compact design. Because the preferred flex tape substrate material is capable of withstanding a bend of 180° angle at a radius of at least ⅛", the flex tape substrate 32, 62 can fold on top of itself to help space constraints in certain designs. A more compact design is achieved by the placement of die attach pads 36 along one edge of the semiconductor die 34, thus eliminating extra width required in the conventional module to place connection pads around the entire periphery of the die. Assembly process steps also are eliminated by the design because it is not necessary to provide an opening through the flex tape substrate, and a substrate layer is eliminated. In addition, assembly is simplified, particular in the areas of making electrical connections, because electrical connections are formed only along one edge of the semiconductor die 34, instead of around the entire periphery of the semiconductor die.

The semiconductor die 34 is connected to the flex tape substrate 32, 62 in order to provide electrical communication between the semiconductor die 34 and an external device (not shown).

The above-described semiconductor die modules 30, 60 are only a few exemplary embodiments of the present invention. For example, although the semiconductor die 34 is illustrated in module 60 as being on an end of the flex substrate 62, the semiconductor die 34 could be placed anywhere along the length of the substrate 62, and, therefore, the invention is not limited to the illustrated embodiments.

Further, semiconductor die modules 30, 60 are illustrated with an optional IR cover glass 70 adhered directly to semiconductor die 34; however, the IR cover glass 70 could be supported by a frame, or replaced with an IR lens, eliminating the need for the IR cover glass 70 altogether. In certain applications, an IR filter 70 or lens are not needed at all.

Similarly, the illustrated semiconductor die packages 30, 60 have conductive lines 40, 66 that are formed within the elastomeric substrate 32, 62; however, conductive lines 40, 66 may be formed on the surface of either the top or bottom side of the flex tape substrate 32, 62.

Figure 1:
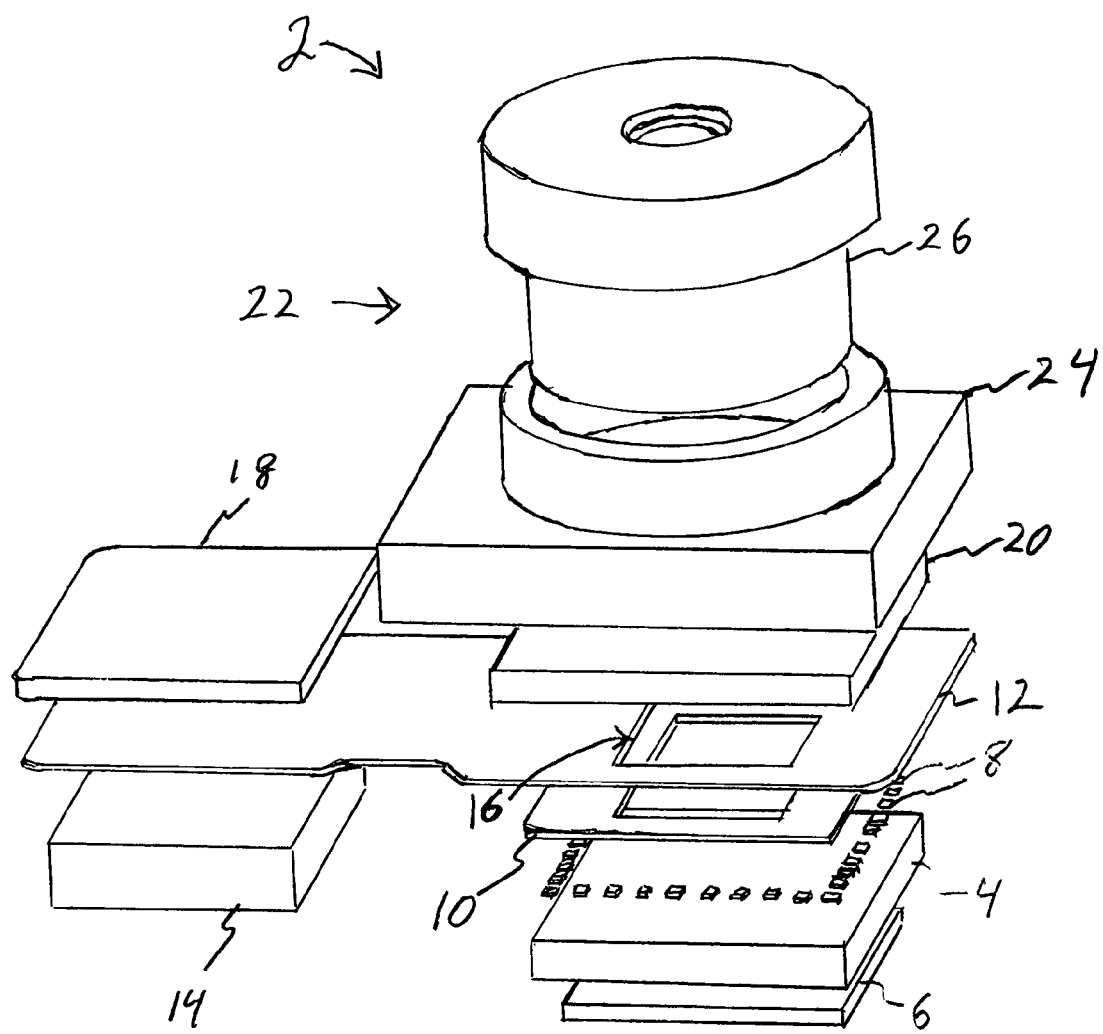
FIG. 1 illustrates an exploded perspective view of a conventional semiconductor imager module.

Each semiconductor die module 30, 60 could further include an optional conventional cushion 6 (FIG. 1) formed underneath the semiconductor die module 30, 60. The semiconductor die module 30, 60 can be coupled to peripheral circuitry (not shown), which includes a processor, for example, or inserted into a camera housing, thereby forming an imaging apparatus, e.g., a digital camera.

Figure 10:
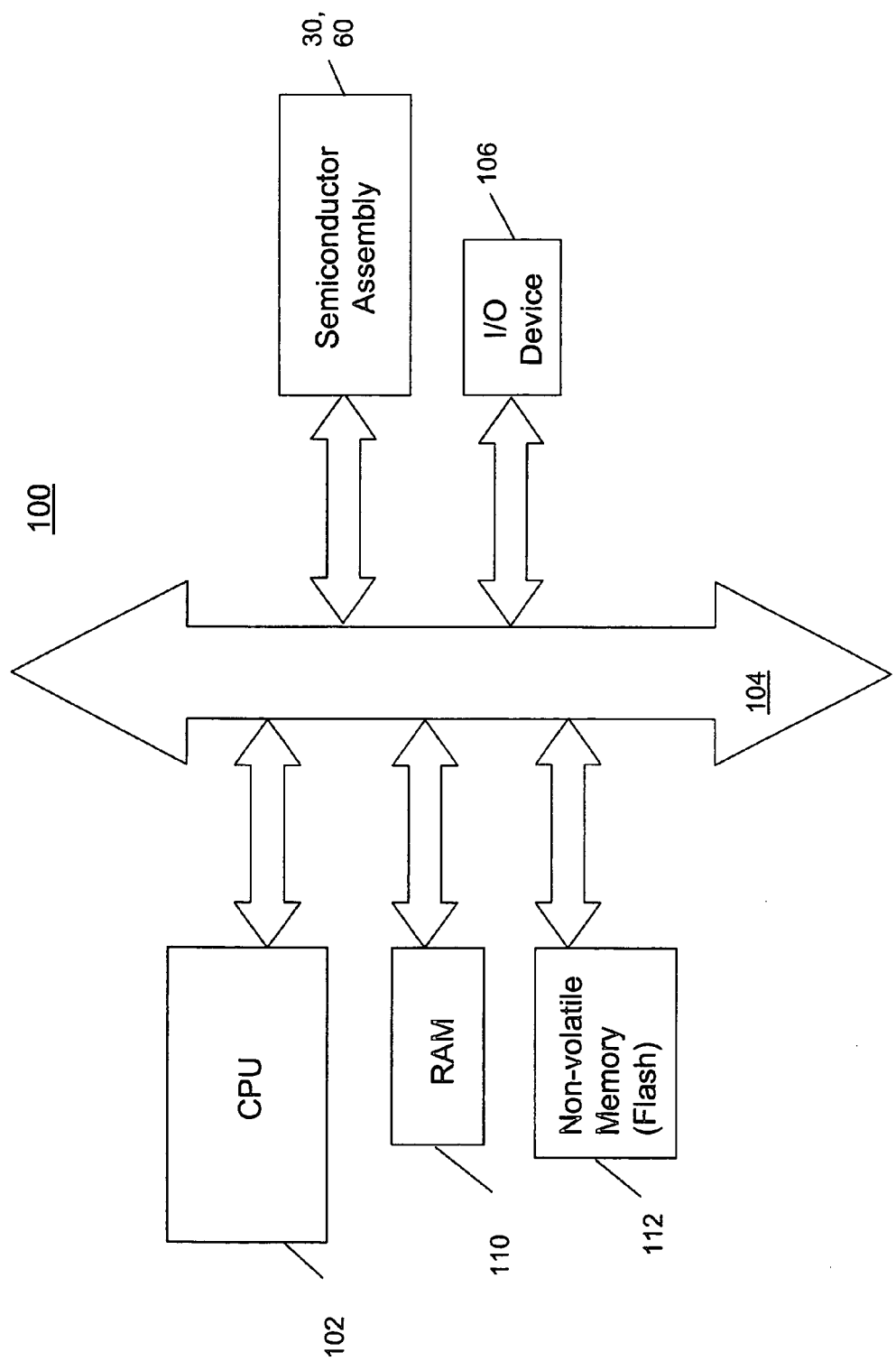
FIG. 10 schematically represents a processor system including a semiconductor imaging device according to the present invention.

FIG. 10 illustrates a diagram of a typical processor system 100 which includes a semiconductor assembly 30, 60, described above. System 100 includes a processor 102 having a central processing unit (CPU) that communicates with various devices over a bus 104. Some of the devices connected to the bus 104 provide communication into and out of the processor based system 100; an input/output (I/O) device 106 and the semiconductor assembly 30, 60 are examples of such communication devices. Other devices connected to the bus 104 provide memory, illustratively including a random access memory (RAM) 110 and a non-volatile memory 112, e.g., a flash memory. The semiconductor assembly 30, 60 may receive control or other data from CPU 102 or other components of system 100. The semiconductor assembly 30, 60 may, in turn, provide signals defining images to processor 102 for image processing, or other image handling operations.

It should be noted that although the invention has been described with specific references to a semiconductor die package containing a semiconductor die with a pixel array, such as a CCD or CMOS sensor, the invention has broader applicability and may be used with any imaging or displaying semiconductor die. In the latter case, an image is displayed on the semiconductor die, and viewed through the lens system.

The above description and drawings illustrate preferred embodiments which achieve the objects, features, and advantages of the present invention. Although certain advantages and preferred embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed as new and desired to be protected by Letters Patent of the United States is:

1. A semiconductor module, comprising:
    a dielectric flex tape substrate having a first tape surface, an opposite second tape surface, a plurality of tape terminal pads on the first tape surface, and a plurality of traces, each trace electrically connecting to a respective one of the tape terminal pads on the first tape surface of the tape substrate; and
    a semiconductor die having a first die surface, an opposite second die surface, a side edge, and a plurality of die attach pads disposed only on the first die surface adjacent the side edge, the opposite second die surface of the semiconductor die being attached directly to and overlapping the first tape surface of the tape substrate and having electrical connections between the die attach pads and respective tape terminal pads.

2. The semiconductor module of claim 1, wherein the semiconductor die contains an array of pixels.

3. The semiconductor module of claim 2, further comprising a lens structure disposed over the array of pixels.

4. The semiconductor module of claim 3, wherein the lens structure is disposed on the array of pixels.

5. The semiconductor module of claim 2, wherein the pixel array includes CMOS pixels.

6. The semiconductor module of claim 2, further comprising a cover glass over the pixel array.

7. The semiconductor module of claim 6, wherein the cover glass is an infrared cut filter.

8. The semiconductor module of claim 6, wherein the cover glass is adhered directly to the die.

9. The semiconductor module of claim 6, further comprising a lens structure disposed over the cover glass.

10. The semiconductor module of claim 6, further comprising a lens holder disposed over the cover glass.

11. The semiconductor module of claim 10, wherein the lens holder is disposed on the cover glass.

12. The semiconductor module of claim 2, further comprising a lens holder disposed over the pixel array.

13. The semiconductor module of claim 1, further comprising an encapsulant applied to the electrical connections between the die attach pads and the respective tape terminal pads.

14. The semiconductor module of claim 1, wherein the tape substrate partially overlaps the first die surface.

15. The semiconductor module of claim 1, further comprising an encapsulant applied to the electrical connections between the die attach pads and the respective tape terminal pads.

16. The semiconductor module of claim 1, wherein the tape substrate at least partially overlaps the second die surface.

17. The semiconductor module of claim 16, wherein the electrical connections are made using wire bonding.

18. A camera module, comprising:
    a dielectric flex tape substrate having a first tape surface, an opposite second tape surface, a plurality of tape terminal pads on the first tape surface, and a plurality of traces, each trace electrically connecting to a respective one of the terminal pads;
    a semiconductor die having a pixel array, a first die surface, an opposite second die surface, a side edge, and a plurality of die attach pads disposed only on the first die surface adjacent the side edge, the opposite second die surface of the semiconductor die being attached directly to and overlapping the first tape surface of the tape substrate and having electrical connections between die attach pads and respective tape terminal pads; and
    a lens structure disposed over the pixel array.

19. The camera module of claim 18, further comprising a cover glass disposed between the lens structure and the pixel array.

20. The camera module of claim 18, wherein the pixel array includes CMOS pixels.

21. The camera module of claim 18, wherein the pixel array includes CCD pixels.

22. The camera module of claim 18, wherein said electrical connections are formed by wire bonds.

23. The camera module of claim 18, further comprising an infrared lens formed over said semiconductor die.

24. An imaging apparatus comprising:
   a processor; and
   a camera module electrically connected to the processor, comprising:
      a dielectric flex tape substrate having a first tape surface, an opposite second tape surface, a plurality of tape terminal pads on the first tape surface, and a plurality of traces, each trace electrically connecting to a respective one of the terminal pads;
      a semiconductor die having a pixel array, a first die surface, an opposite second die surface, a die attach end, and a plurality of die attach pads on the first die surface adjacent the die attach end, the opposite second die surface of the semiconductor die being attached directly to and overlapping the first tape surface of the tape substrate and having electrical connections between die attach pads and respective tape terminal pads; and
      a lens structure disposed over the pixel array.

25. The imaging apparatus of claim 24, further comprising a cover glass disposed between the lens structure and the pixel array.

26. The imaging apparatus of claim 24, wherein the pixel array includes CMOS pixels.

27. The imaging apparatus of claim 24, wherein the pixel array includes CCD pixels.

28. The imaging apparatus of claim 24, wherein said electrical connections are formed by wire bonds.

29. The imaging apparatus of claim 24, further comprising an infrared lens formed over said semiconductor die.

30. A method of forming a semiconductor die package, said method comprising the acts of:
   providing a semiconductor die having a first die surface, a second opposite die surface, a side edge, and a plurality of die attach pads disposed only on the first die surface adjacent the side edge;
   attaching to the second opposite die surface a dielectric flex tape substrate having a first tape surface, a second opposite tape surface, a plurality of tape terminal pads on the first tape surface, and a plurality of traces, each trace electrically connecting to a respective one of the tape terminal pads on the first tape surface of the tape substrate to the semiconductor die; and
   forming electrical connections between the die attach pads adjacent the side edge of the die and respective tape terminal pads on the first tape surface of the tape substrate.

31. The method of forming a semiconductor module according to claim 30, wherein the tape substrate completely overlaps the second surface of the semiconductor die.

32. The method of forming a semiconductor module according to claim 30, wherein the electrical connections are formed by wire bonds.

33. The method of forming a semiconductor module according to claim 30, wherein the semiconductor die includes an array of pixels.

34. The method of forming a semiconductor module according to claim 33, further comprising disposing a lens structure over the array of pixels.

35. The method of forming a semiconductor module according to claim 34, wherein the lens structure is disposed on the array of pixels.

36. The method of forming a semiconductor module according to claim 33, wherein the pixel array includes CMOS pixels.

37. The method of forming a semiconductor module according to claim 33, wherein the pixel array includes CCD pixels.

38. The method of forming a semiconductor module according to claim 33, further comprising installing a cover glass over the pixel array.

39. The method of forming a semiconductor module according to claim 38, wherein the cover glass is an infrared cut filter.

40. The method of forming a semiconductor module according to claim 38, wherein the cover glass is adhered directly to the die.

41. The method of forming a semiconductor module according to claim 38, further comprising disposing a lens structure over the cover glass.

42. The method of forming a semiconductor module according to claim 38, further comprising disposing a lens holder over the cover glass.

43. The method of forming a semiconductor module according to claim 42, wherein the lens holder is disposed on the cover glass.

44. The method of forming a semiconductor module according to claim 30, further comprising disposing a lens holder on the pixel array.

45. The method of forming a semiconductor module according to claim 30, further comprising applying an encapsulant to the electrical connections between the die attach pads adjacent the edge of the die and the respective tape terminal pads on the first tape surface near the end of the tape substrate.

46. The method of forming a semiconductor module according to claim 30, wherein the tape substrate partially overlaps the first die surface.

* * * * *

UNITED STATES PATENT AND TRADEMARK OFFICE
CERTIFICATE OF CORRECTION

PATENT NO. : 6,979,902 B2
DATED : December 27, 2005
INVENTOR(S) : Larry D. Kinsman It is certified that error appears in the above-identified patent and that said Letters Patent is hereby corrected as shown below:

Column 8,
Lines 49-50, "surface near the top of the substrate." should read -- surface. --.

Signed and Sealed this

Twenty-eighth Day of March, 2006

JON W. DUDAS
*Director of the United States Patent and Trademark Office*